(12) United States Patent
Zhang et al.

(10) Patent No.: US 11,251,050 B2
(45) Date of Patent: *Feb. 15, 2022

(54) SILICON OXIDE SELECTIVE DRY ETCH PROCESS

(71) Applicants: Mattson Technology, Inc., Fremont, CA (US); Beijing E-Town Semiconductor Technology Co., Ltd., Beijing (CN)

(72) Inventors: Qi Zhang, San Jose, CA (US); Xinliang Lu, Fremont, CA (US); Hua Chung, Saratoga, CA (US); Haichun Yang, San Jose, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/904,669

(22) Filed: Jun. 18, 2020

(65) Prior Publication Data

US 2021/0066088 A1 Mar. 4, 2021

Related U.S. Application Data

(63) Continuation of application No. 16/557,346, filed on Aug. 30, 2019, now Pat. No. 10,692,730.

(51) Int. Cl.
*H01L 21/311* (2006.01)
*H01L 21/02* (2006.01)
*H01L 21/3213* (2006.01)

(52) U.S. Cl.
CPC .... *H01L 21/31116* (2013.01); *H01L 21/0206* (2013.01); *H01L 21/32137* (2013.01)

(58) Field of Classification Search
CPC .......... H01L 21/31116; H01L 21/0206; H01L 21/32137
See application file for complete search history.

(56) References Cited

U.S. PATENT DOCUMENTS 5,376,233 A 12/1994 Yong
5,658,417 A 8/1997 Watanabe et al.
(Continued)

OTHER PUBLICATIONS

International Search Report and Written Opinion for Application No. PCT/US2020/047878, dated Nov. 30, 2020, 10 pages.
(Continued)

*Primary Examiner* — Anita K Alanko
(74) *Attorney, Agent, or Firm* — Dority & Manning, P.A.

(57) ABSTRACT

Systems and methods for processing a workpiece are provided. In one example, a method includes exposing the workpiece to a first gas mixture when the workpiece is at a first temperature to conduct a doped silicate glass etch process. The first gas mixture can include hydrofluoric acid (HF) vapor. The doped silicate glass etch process at least partially removes the doped silicate glass layer at a first etch rate that is greater than a second etch rate associated with removal of the at least one second layer. The method can include heating the workpiece to a second temperature. The second temperature is greater than the first temperature. The method can include exposing the workpiece to a second gas mixture when the workpiece is at a second temperature to remove a residue from the workpiece.

20 Claims, 8 Drawing Sheets

(56) References Cited

U.S. PATENT DOCUMENTS

| | | |
|---|---|---|
| 8,206,605 B2 | 6/2012 | Hayashi |
| 9,202,708 B1 | 12/2015 | Chen et al. |
| 10,424,487 B2 | 9/2019 | Ko |
| 10,692,730 B1 | 6/2020 | Zhang et al. |
| 2006/0046419 A1 | 3/2006 | Sandhu et al. |
| 2008/0124936 A1 | 5/2008 | Nishimura |
| 2008/0182383 A1 | 7/2008 | Lee |
| 2009/0111280 A1 | 4/2009 | Kao |
| 2012/0211462 A1 | 8/2012 | Zhang |
| 2013/0095665 A1 | 4/2013 | Lee |
| 2013/0137267 A1 | 5/2013 | Chang |
| 2014/0271097 A1 | 9/2014 | Wang et al. |
| 2015/0072508 A1* | 3/2015 | Or ................. H01L 21/324 438/466 |
| 2015/0262834 A1* | 9/2015 | Belostotskiy ..... H01J 37/32422 438/705 |
| 2015/0270122 A1* | 9/2015 | Tolle ................. H01L 21/02636 438/607 |
| 2018/0122633 A1 | 5/2018 | Leeser |
| 2019/0013207 A1 | 1/2019 | Kobayashi |

OTHER PUBLICATIONS

Watanabe et al. "Selective Etching of Phosphosilicate Glass with Low Pressure Vapor HF," *Journal of the Electrochemical Society*, 142(1), Jan. 1995, pp. 237-243.

Witvrouw et al. "Comparison between wet HF etching and vapor HF etching for sacrificial oxide removal," *Micromachining and Microfabrication Process Technology VI*, Proceedings of SPIE Vo. vol. 4174 (Aug. 2000), pp. 130-141.

Johnson et al., WO3 and W Thermal Atomic Layer Etching Using "Conversion-Fluorination" and "Oxidation-Conversion-Fluorination" Mechanisms, *ACS Applied Materials & Interfaces*, 2017, 9(39), pp. 34435-34447.

* cited by examiner

SILICON OXIDE SELECTIVE DRY ETCH PROCESS

PRIORITY CLAIM

The present application is based on and claims priority to U.S. application Ser. No. 16/557,346, entitled "Silicon Oxide Selective Dry Etch Process," having a filing date of Aug. 30, 2019, which is incorporated by reference herein.

FIELD

The present disclosure relates generally to processing of a workpiece, such as a semiconductor workpiece.

BACKGROUND

The processing of semiconductor workpieces can involve deposition, patterning and removal of different materials layers on a substrate to form a multilayer structure. For better patterning alignment in 3D device structure fabrication, each layer is approximately planar. In each layer, dielectric materials such as silicate glasses can be used to separate structures and insulate conductive materials. Doped silicate glass including borosilicate glass (BSG), phosphosilicate glass (PSG) and borophosphosilicate glass (BPSG) is commonly used as the dielectric or insulating layer between conductive materials because its melting point is typically much lower than regular glass or other dielectric materials. A lower melting temperature allows a reflow of doped silicate glass at a relative low temperature into patterned structures before planarization.

Silicate glass films can be deposited by plasma enhanced chemical vapor deposition (PECVD) system using liquid tetraethoxysilane (TEOS) as a source of silicon instead of hazardous silane gas. BSG, PSG or BPSG films can be deposited with addition of boron and phosphorus precursors in PECVD processes, respectively. The boron and/or phosphorus precursors could be organic or inorganic in nature. For instance, the boron precursors can include $B_2H_6$ and TEB (triethylborate), and the phosphorus precursors can include $PH_3$ and TEPO (triethylphosphate).

Certain process manufacturing flow designs call for removal of reflowed doped silicate glass inside patterned structures, including some silicate glass liftoff processes in high capacity Dynamic Random Access Memory (DRAM) device fabrication. It is desirable to remove doped silicate glass with high selectivity towards other materials, such as undoped silicate glass, silicon nitride, titanium nitride, and silicon (e.g., polysilicon). Device dimension continues to decrease, and device structure aspect ratio continues to increase in semiconductor manufacturing. Thus the requirements on etch selectivity are becoming more stringent.

Wet etch processes are common in semiconductor manufacturing. However, conventional wet etch processes have some intrinsic problems and start to reach limitations in advanced semiconductor fabrications, especially in removing significant amount of materials inside small and high-aspect ratio structures. Wet etch rate can be limited by process temperature. It can be further constrained by a slow diffusion of wet etch chemical precursors into and wet etch chemical reaction products out of high aspect ratio nanostructures. In addition, a complete removal of wet chemicals from high aspect ratio nanostructures after the wet etch process can be very challenging, as most of the wet etch chemical precursors and wet etch reaction products are not volatile, thus prone to leave residues inside high aspect ratio nanostructures with standard wafer rinse and spin-dry processes. An insufficient post wet-etch wafer clean/dry can also result in surface corrosion and particle contamination on wafer surfaces. Finally, narrow and high aspect ratio nanostructures in advanced semiconductor devices are very fragile, and surface tension in wet etch processes can lead to significant pattern damage and sometimes pattern collapse and device failure.

Comparing with wet etch processes, vacuum based dry etch processes can be more effective, more efficient, more versatile and more suitable for materials removal inside high aspect ratio nanostructures. Workpiece temperature can be more flexible in dry etch processes to optimize etch rate and selectivity and to accommodate process integration requirements. In addition, vacuum based dry etch processes have better extendibility for materials removal inside high aspect ratio nanostructures with gas phase precursor adsorption and volatile reaction product desorption. Finally, as mentioned above, wet etch processes can have issues with surface tension induced pattern collapse and post etch residues inside high aspect ratio structures. They are in general not issues for gas phase based dry etch processes.

SUMMARY

Aspects and advantages of embodiments of the present disclosure will be set forth in part in the following description, or may be learned from the description, or may be learned through practice of the embodiments. One example aspect of the present disclosure is directed to a method for etching a doped silicate glass layer on a workpiece. The workpiece can include a doped silicate glass layer and at least one second layer. The second layer can be a different material relative to the doped silicate glass layer. The method can include exposing the workpiece to a first gas mixture when the workpiece is at a first temperature to conduct a doped silicate glass etch process. The first gas mixture can include hydrofluoric acid (HF) vapor. The doped silicate glass etch process at least partially removes the doped silicate glass layer at a first etch rate that is greater than a second etch rate associated with removal of the at least one second layer. The method can include heating the workpiece to a second temperature. The second temperature is greater than the first temperature. The method can include exposing the workpiece to a second gas mixture when the workpiece is at a second temperature to remove a residue from the workpiece.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
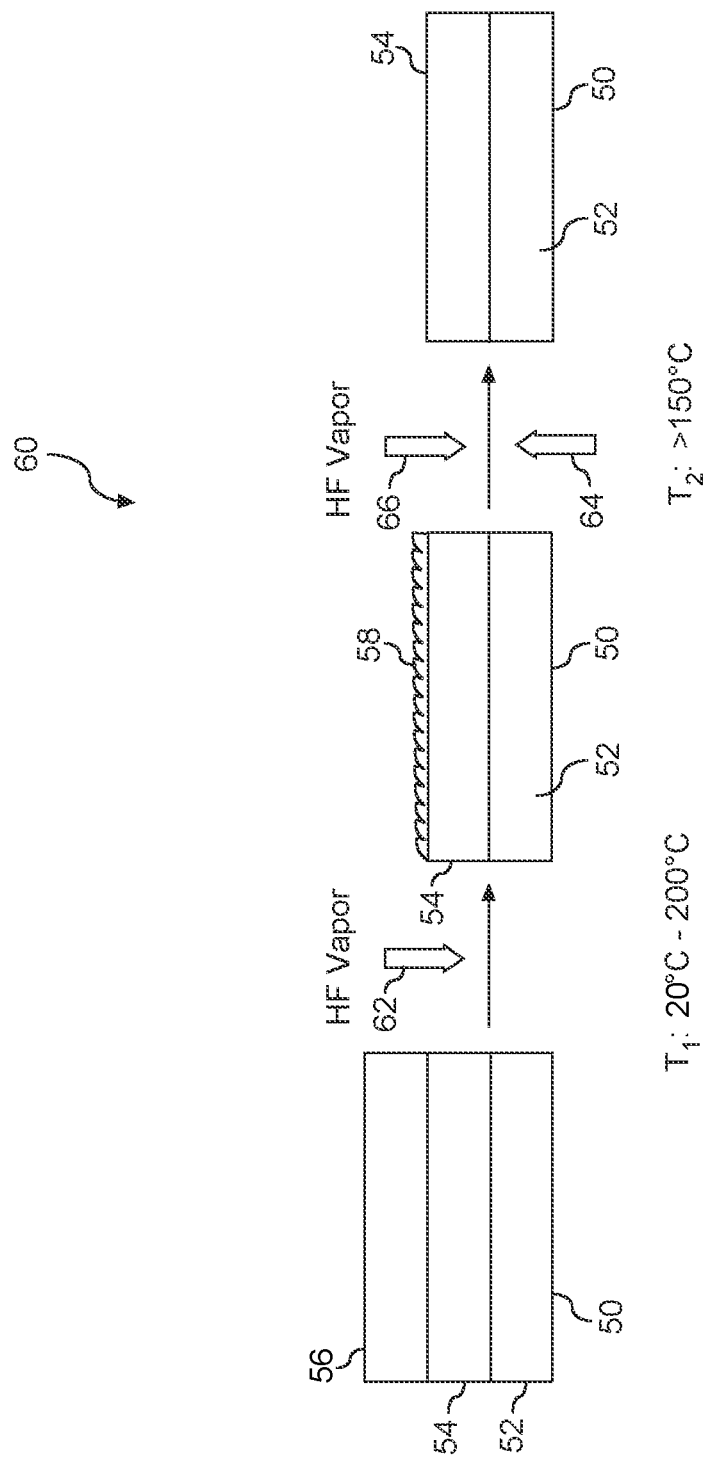
FIG. 1 depicts an overview of an example process according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to processing a workpiece, such as a semiconductor workpiece. For instance, example aspects of the present disclosure are directed to processes for removal of doped silicate glass materials (e.g., BSG, PSG and BPSG) with high selectivity relative to other materials on a workpiece.

Processes according to example aspects of the present disclosure can provide a dry etch process for removing doped silicate glass materials selectively relative to other materials on a workpiece. For instance, an all-dry process can include exposing the workpiece to a gas mixture including hydrofluoric acid (HF) vapor at a first temperature. The first temperature can be, for instance, in the range of about 20° C. to about 200° C., such as about 50° C. To remove surface residue, the process can include heating the workpiece to a second temperature that is greater than the first temperature and continuing exposure of the workpiece to the gas mixture including the HF vapor. The second temperature can be, for instance, about 150° C. to 400° C.

The processes according to example aspects of the present disclosure can yield a fast and clean removal of a doped silicate glass that is selective relative to other materials on a workpiece, such as undoped silicate glass, silicon nitride, titanium nitride and silicon. For example, BPSG thin films can be removed at an etch rate of about 5000 Å/min or greater, and there is no BPSG and etch residue afterward. In some instances, etch selectivity of doped silicate glasses can be about or greater than 1000:1 relative to undoped silicate glass, silicon nitride, titanium nitride, silicon, and other materials.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable workpiece. In addition, the use of the term "about" in conjunction with a numerical value is intended to refer to within ten percent (10%) of the stated numerical value. A "pedestal" refers to any structure that can be used to support a workpiece.

FIG. 1 depicts an overview of an example process 60 for removing a doped silicate glass (BSG, PSG, BPSG) layer according to example aspects of the present disclosure. The process 60 can be performed on a workpiece 50 (e.g., a semiconductor wafer). A portion of the workpiece 50 is illustrated in FIG. 1. The workpiece 50 can include a first layer that is a doped silicate glass (BSG, PSG, BPSG) layer 56 and at least one second layer 54. The at least one second layer 54 can be of, for instance, undoped silicate glass, silicon nitride, titanium nitride, silicon, or other materials. The doped silicate glass (BSG, PSG, BPSG) layer 56 and the at least one second layer 54 can be disposed, for instance, on a substrate 52 (e.g., silicon or other semiconductor substrate).

In some embodiments, the doped silicate glass layer 56 is borosilicate glass (BSG) having a boron concentration between about 1% and about 10%. In some embodiments, the doped silicate glass layer 56 is phosphosilicate glass (PSG) having a phosphorus concentration between about 1% and about 10%. In some embodiments, the doped silicate glass layer 56 is borophosphosilicate glass (BPSG) layer having a boron concentration between about 1% and about 10% and having a phosphorus concentration between about 1% and about 10%.

At 62, the process 60 can include exposing the workpiece 50 (e.g., in particular the doped silicate glass layer 56) to a gas mixture that includes HF vapor to implement a doped silicate glass removal process. The gas mixture, in some embodiments, can also include a carrier gas. The carrier gas can be, for instance, nitrogen, helium, argon, xenon or other inert gas. The gas mixture does not include more than residual amounts (e.g., more than about 2% of the gas mixture) of water vapor.

The HF vapor can be exposed to the workpiece 50 when the workpiece 50 is at a first temperature. The first temperature can be in the range of about 20° C. to about 200° C., such as about 50° C. The HF vapor can be delivered from an HF vapor source. In some embodiments, the HF vapor can be generated in a remote plasma source from a first precursor containing fluorine and a second precursor containing hydrogen. The etch rate of the doped silicate glass layer can be controlled by adjusting the first temperature within the range of about 20° C. to about 200° C. (e.g., using heating elements, heat lamps, cooling systems, etc.).

Heating the workpiece 50 to the first temperature can be accomplished using a heat source. In one example, the heat source can be a hot plate in a direct physical contact to or in proximity to the workpiece 50. In one example, the workpiece 50 can be in a direct physical contact to the hot plate, and the hot plate can also be used as a pedestal to support the workpiece 50. In another example, the workpiece 50 can be placed in proximity to the hot plate, e.g. positioned on top of a few support pins and parallel to the hot plate. The hot plate can be heated using one or more heating elements (e.g., electrical or fluid based heating elements). The hot plate can be also heated by some radiative heating sources. In yet another example, the workpiece 50 can be heated in the absence of a hot plate directly with radiations from one or more heating lamps (e.g., incandescent lamps, fluorescent lamps, halogen lamps, LED lamps, gas discharge lamps, arc lamps, etc.) or radiation from other heat sources (e.g. a remote plasma source).

As shown in FIG. 1, exposure of the workpiece to the HF vapor at 60 can leave a residue layer 58 on the workpiece 50.

The residue layer 58 can include a boron containing substance and/or a phosphorus containing substance. For instance, the residue can include one or more of $B_2O_3$, $H_3BO_3$, $P_2O_5$, $H_3PO_4$, etc. The residue can also include etch byproduct, such as $H_2SiF_6$ and $H_2O$.

As shown in FIG. 1, the residue layer 58 can be removed by heating the workpiece as shown at 64 to a second temperature and exposing the workpiece to a gas mixture that includes HF vapor as shown at 66. The second temperature can be higher than the first temperature. For instance, the second temperature can be about 150° C. to 400° C. As shown in FIG. 1, this can result in the selective removal of the doped silicate glass layer 56 relative to the at least one second layer 54 and can leave a clean surface with minimal or no residue.

Heating the workpiece 50 to the second temperature can be accomplished using a heat source. In one example, the heat source can be a hot plate in a direct physical contact to or in proximity to the workpiece 50. In one example, the workpiece 50 can be in a direct physical contact to the hot plate, and the hot plate can also be used as a pedestal to support the workpiece 50. In another example, the workpiece 50 can be placed in proximity to the hot plate, e.g. positioned on top of a few support pins and parallel to the hot plate. The hot plate can be heated using one or more heating elements (e.g., electrical or fluid based heating elements). The hot plate can be also heated by some radiative heating sources. In yet another example, the workpiece 50 can be heated in absence of a hot plate directly with radiations from one or more heating lamps (e.g., incandescent lamps, fluorescent lamps, halogen lamps, LED lamps, gas discharge lamps, arc lamps, etc.) or radiation from other heat sources (e.g. a remote plasma source)

In some embodiments, the doped silicate glass etch process and the residue removal process can be integrated and performed in the same processing chamber (e.g., in-situ in the same processing chamber). In some embodiments, the doped silicate glass etch process at the first temperature and the residue removal process at the second temperature can be performed sequentially on a single pedestal inside the chamber. For instance, the workpiece can be continuously exposed to a gas mixture including the HF vapor. In some other embodiments, the doped silicate glass etch process and the residue removal process can be performed sequentially on different pedestals in the same chamber, with the different pedestals being operated at different temperatures. The chamber can be designed with the separate pedestals in a carousel configuration.

Other implementations can be used without deviating from the scope of the present disclosure. For instance, in some other embodiments, the doped silicate glass etch process and the residue removal process can be performed in separate chambers on a cluster tool without vacuum break. In yet some other embodiments, the doped silicate glass etch process and the residue removal process can be performed in separate chambers as part of separate processing tools.

Figure 2:
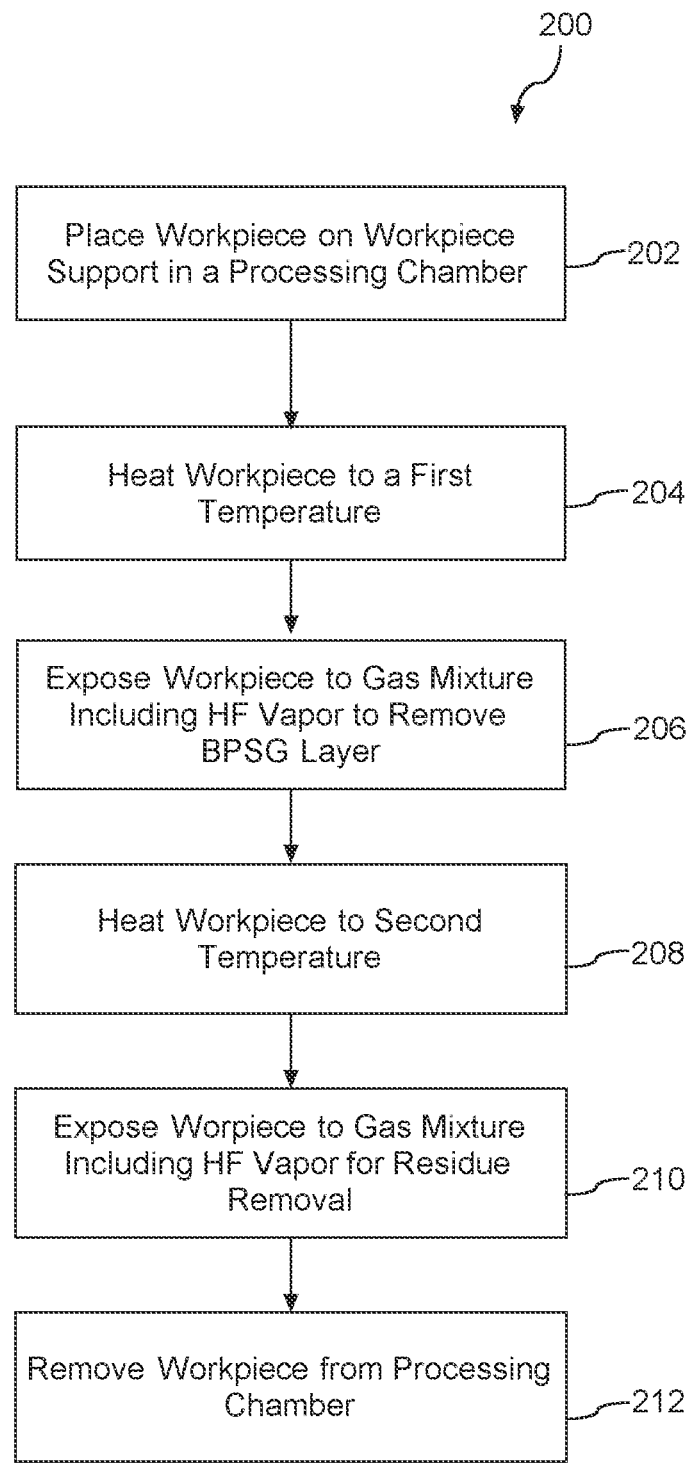
FIG. 2 depicts a flow diagram of an example method according to example embodiments of the present disclosure.

FIG. 2 depicts a flow diagram of an example method (200) according to example aspects of the present disclosure. The method (200) can be performed using a suitable processing apparatus, such as the processing apparatus(s) discussed in more detail with referenced to FIGS. 3 and 4. FIG. 2 depicts steps performed in a particular order for purposes of illustration and discussion. Those of ordinary skill in the art, using the disclosures provided herein, will understand that the steps of any of the methods provided herein can be adapted, modified, omitted, performed simultaneously, include steps not illustrated, rearranged, and/or expanded in various ways without deviating from the scope of the present disclosure.

Figure 3:
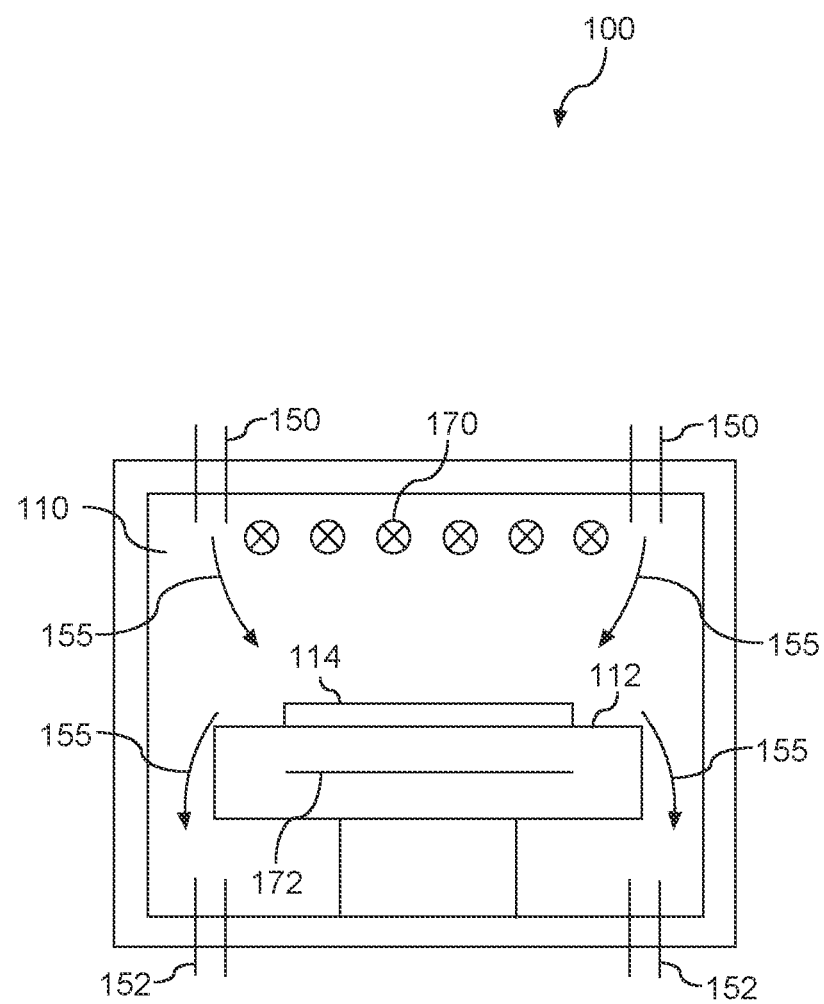
FIG. 3 depicts an example processing apparatus according to example embodiments of the present disclosure.

At (202), the method includes placing a workpiece on a workpiece support in a processing chamber 110. For instance, as shown in FIG. 3, the method can include placing a workpiece 114 on a workpiece support 112 in a processing chamber 110 of a processing apparatus 100. The workpiece 114 can include a doped silicate glass layer and one or more second layers, such as undoped silicate glass layers, silicon nitride layers, titanium nitride layers, and silicon layers, etc.

At (204) of FIG. 2, the method can include heating the workpiece to a first temperature. The first temperature can be, for instance, in a range of about 20° C. to about 200° C., such as about 50° C. The first temperature can be adjusted and/or selected to obtain a desired etch rate for the doped silicate glass layer.

As an example, in the example embodiment illustrated in FIG. 3, the workpiece 114 can be heated, for instance, using heating elements 172 disposed in the workpiece support 112. The heating elements 172 can be electric heaters, heated fluid channels, lamps, etc. In some embodiments, the workpiece 114 can be heated directly, for instance, using lamp heat sources 170. The lamp heat sources 170 can be incandescent lamps, fluorescent lamps, halogen lamps, LED lamps, gas discharge lamps, arc lamps or other suitable radiation sources configured to heat a workpiece.

At (206), the method can include exposing the workpiece to a gas mixture including an HF vapor to at least partially remove the doped silicate glass layer. The gas mixture can include HF vapor and a carrier gas. The carrier gas can be, for instance, an inert gas, such as helium, argon, neon, and/or nitrogen gas.

For instance, as shown in FIG. 3, the apparatus can include a gas flow system that includes, for instance, a gas supply 150 and gas exhaust 152 configured to flow a gas mixture 155 including HF vapor through the processing chamber 110 containing the workpiece 114. In this way, the apparatus can expose the workpiece 114 to the gas mixture 155 including HF vapor for at least partial removal of the doped silicate glass layer.

At (208) of FIG. 2, the method can include heating the workpiece to a second temperature. The second temperature can be greater than the first temperature. For instance, the second temperature can be, for instance, 150° C. to 400° C.

As an example, referring to the example embodiment illustrated in FIG. 3, the workpiece 114 can be heated to the second temperature, for instance, using heating elements 172 disposed in the workpiece support 112. The heating elements 172 can be electric heaters, heated fluid channels, lamps, etc. In some embodiments, the workpiece 114 can be heated to the second temperature, for instance, using lamp heat sources 170. The lamp heat sources 170 can be incandescent lamps, fluorescent lamps, halogen lamps, LED lamps, gas discharge lamps, arc lamps or other suitable radiation sources configured to heat a workpiece.

At (210) of FIG. 2, the method can include exposing the workpiece to a gas mixture including HF vapor at the second temperature to remove residue on the workpiece. The residue can include a boron containing substance and/or a phosphorus containing substance. For instance, the residue can include one or more of $B_2O_3$, $H_3BO_3$, $P_2O_5$, $H_3PO_4$, etc. The residue can also include etch byproduct, such as $H_2SiF_6$ and $H_2O$.

In some embodiments, the gas mixture can be the same gas mixture exposed to the workpiece at (206). For instance, there can be a continuous exposure of the gas mixture to the workpiece while the workpiece is heated from the first temperature to the second temperature to remove the residue on the workpiece.

As an example, in the embodiment illustrated in FIG. 3, the gas flow system of the apparatus 100 can continuous flow the gas mixture 155 into the processing chamber 110 for exposure to the workpiece 114 while the workpiece 114 is heated from the first temperature to the second temperature and while the workpiece 114 is maintained at the second temperature for the residue removal process.

Referring back to FIG. 2, the method can include at (212) removing the workpiece from the processing chamber. For instance, the workpiece 114 can be removed from the processing chamber 110 of the apparatus 100. In this way, both the doped silicate glass etch process and the residue removal process can be performed in-situ in the same processing chamber.

The methods according to example embodiments of the present disclosure can be implemented using other types of processing apparatus without deviating from the scope of the present disclosure. For instance, the method can be performed using a plasma processing apparatus that includes a remote plasma source for generating radicals and other species for processing a workpiece.

Figure 4:
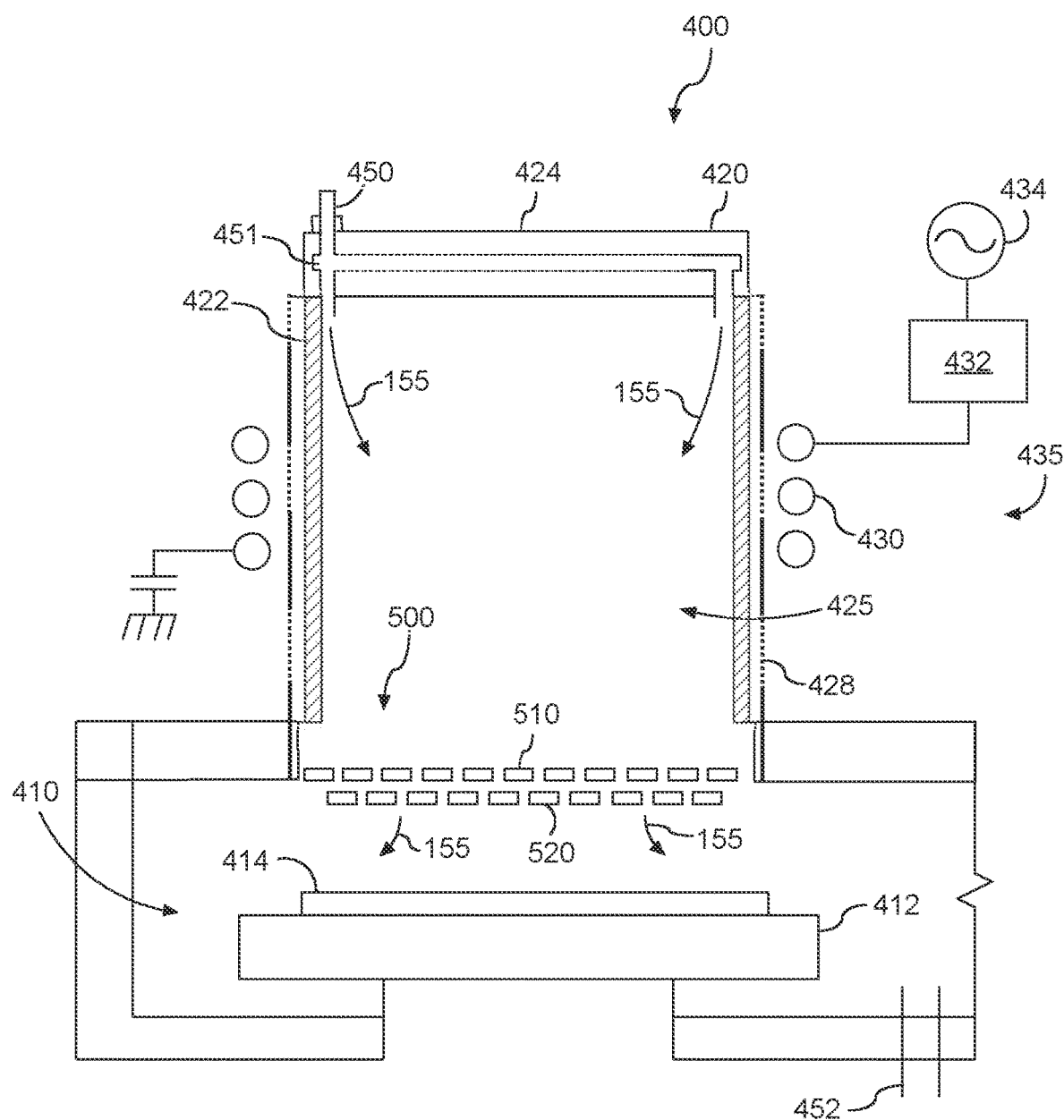
FIG. 4 depicts an example plasma processing apparatus according to example embodiments of the present disclosure.

FIG. 4 depicts an example plasma processing apparatus 400 the can be used to implement the methods according to example embodiments of the present disclosure. As illustrated, plasma processing apparatus 400 can include a processing chamber 410 and a plasma chamber 420 that is separate from the processing chamber 410. Processing chamber 410 includes a workpiece support 412 operable to hold a workpiece 414 to be processed, such as a semiconductor wafer. In this example illustration, a plasma is generated in plasma chamber 420 (i.e., plasma generation region) by an inductively coupled plasma source 435 and desired species are channeled from the plasma chamber 420 to the surface of workpiece 414 through a separation grid assembly 500.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 420 includes a dielectric side wall 422 and a ceiling 424. The dielectric side wall 422, ceiling 424, and separation grid 500 define a plasma chamber interior 425. Dielectric side wall 422 can be formed from a dielectric material, such as quartz and/or alumina. The inductively coupled plasma source 435 can include an induction coil 430 disposed adjacent the dielectric side wall 422 about the plasma chamber 420. The induction coil 430 is coupled to an RF power generator 434 through a suitable matching network 432. Process gases (e.g., reactant and carrier gases) can be provided to the chamber interior from gas supply 450 and annular gas distribution channel 451 or other suitable gas introduction mechanism. When the induction coil 430 is energized with RF power from the RF power generator 434, a plasma can be generated in the plasma chamber 420. In a particular embodiment, the plasma processing apparatus 400 can include an optional grounded Faraday shield 428 to reduce capacitive coupling of the induction coil 430 to the plasma.

As shown in FIG. 4, a separation grid 500 separates the plasma chamber 420 from the processing chamber 410. The separation grid 500 can be used to perform ion and electron filtering from a mixture generated by plasma in the plasma chamber 420 to generate a filtered mixture. The filtered mixture can be exposed to the workpiece 414 in the processing chamber.

In some embodiments, the separation grid 500 can be a multi-plate separation grid. For instance, the separation grid 500 can include a first grid plate 510 and a second grid plate 520 that are spaced apart in parallel relationship to one another. The first grid plate 510 and the second grid plate 520 can be separated by a distance.

The first grid plate 510 can have a first grid pattern having a plurality of holes. The second grid plate 520 can have a second grid pattern having a plurality of holes. The first grid pattern can be the same as or different from the second grid pattern. Charged particles can recombine on the walls in their path through the holes of each grid plate 510, 520 in the separation grid. Neutral particles (e.g., radicals) can flow relatively freely through the holes in the first grid plate 510 and the second grid plate 520. The size of the holes and thickness of each grid plate 510 and 520 can affect transparency for both charged and neutral particles.

In some embodiments, the first grid plate 510 can be made of metal (e.g., aluminum) or other electrically conductive material and/or the second grid plate 520 can be made from either an electrically conductive material or dielectric material (e.g., quartz, ceramic, etc.). In some embodiments, the first grid plate 510 and/or the second grid plate 520 can be made of other materials, such as silicon or silicon carbide. In the event a grid plate is made of metal or other electrically conductive material, the grid plate can be grounded.

In some embodiments, the method (200) of FIG. 2 can be implemented using the plasma processing apparatus 400 of FIG. 4. For example, at (202) the workpiece 414 can be placed on the workpiece support 412 in the processing chamber. The workpiece 414 can include a doped silicate glass layer and one or more second layers, such as undoped silicate glass layers, silicon nitride layers, silicon nitride layers, and silicon layers etc.

At (204), the workpiece can be heated to a first temperature. The first temperature can be, for instance, in a range of about 20° C. to about 200° C., such as about 50° C. The first temperature can be adjusted and/or selected to obtain a desired etch rate for the doped silicate glass layer. The workpiece 414 can be heated, for instance, using heating elements disposed in the workpiece support 412. The heating elements can be electric heaters, heated fluid channels, lamps, etc. In some embodiments, as discussed in more detail with respect to FIG. 6, the workpiece 414 can be heated to the first temperature by generating a plasma in the remote plasma chamber 420. The workpiece 414 can be heated to the first temperature by maintaining the workpiece a sufficient vertical location relative to the plasma chamber 420.

At (206), the method can include exposing the workpiece to a gas mixture including an HF vapor to implement a doped silicate glass etch process. As shown in FIG. 4, in some implementations, the apparatus can include a gas flow system that can introduce the gas mixture 155 including HF vapor into the plasma chamber 420. There may be no plasma generated in the plasma chamber 420. The gas mixture 155 would continue through the separation grid 500 (acting as a showerhead) into the processing chamber 410 for exposure to the workpiece 414.

The gas mixture 155 including the HF vapor can be introduced into the processing chamber 410 in other ways without deviating from the scope of the present disclosure.

For instance, the gas mixture can be introduced into the processing chamber 410 at or below the separation grid.

Figure 5:
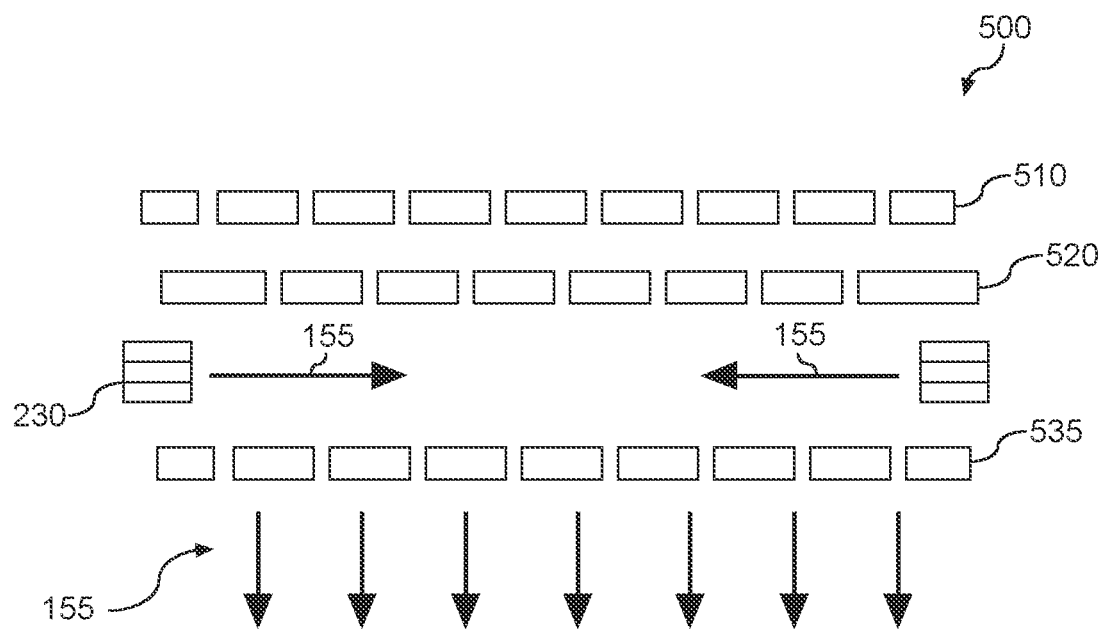
FIG. 5 depicts example gas injection at a separation grid according to example embodiments of the present disclosure.

FIG. 5 depicts example injection of a gas mixture 155 including HF vapor at a separation grid 500 according to example embodiments of the present disclosure. More particularly, the separation grid 500 includes a first grid plate 510 and a second grid plate 520 disposed in parallel relationship for ion/electron/UV filtering.

The first grid plate 510 and a second grid plate 520 can be in parallel relationship with one another. The first grid plate 510 can have a first grid pattern having a plurality of holes. The second grid plate 520 can have a second grid pattern having a plurality of holes. The first grid pattern can be the same as or different from the second grid pattern. Subsequent to the second grid plate 520, a gas injection source 230 can be configured to admit a gas mixture 155 including HF vapor into the separation grid. The gas mixture 155 including HF vapor can pass through a third grid plate 535 for exposure to the workpiece.

The grid assembly 500 can be independently heated by heating elements (not shown). The heating elements can be electric heaters, heated fluid channels, etc.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the gas injection source 230 can be located at other locations relative to the separation grid 500, such as between the first grid plate 510 and the second grid plate 520, below the third grid plate 535, or below the entire separation grid 500. The gas injection source 230 can inject gas at any angle with respect to the separation grid 600.

In some embodiments, the HF vapor can be generated by inducing a plasma in the plasma chamber interior 425 using the plasma source 435 and providing species generated in the plasma through the separation grid 500 for exposure to the workpiece 414. For instance, inductive plasma source 435 can generate plasma in a process gas mixture having F containing precursors (e.g., $F_2$, $CF_4$, $NF_3$, $CF_xH_y$, etc.) and H containing precursors (e.g., $H_2$, $CH_4$, $C_2H_6$, $C_xH_y$, etc.). Species generated in the plasma can pass through the separation grid 500 for exposure to the workpiece.

At (208) the method can include heating the workpiece 414 to a second temperature. The second temperature can be greater than the first temperature. For instance, the second temperature can be, for instance, 150° C. to 400° C. The workpiece 414 can be heated to the second temperature, for instance, using heating elements disposed in the workpiece support 412. The heating elements can be electric heaters, heated fluid channels, lamps, etc. In some embodiments, the workpiece 414 can be heated to the second temperature, for instance, using lamp heat sources (not shown). The lamp heat sources can include incandescent lamps, fluorescent lamps, halogen lamps, LED lamps, gas discharge lamps, arc lamps, etc.

Figure 6:
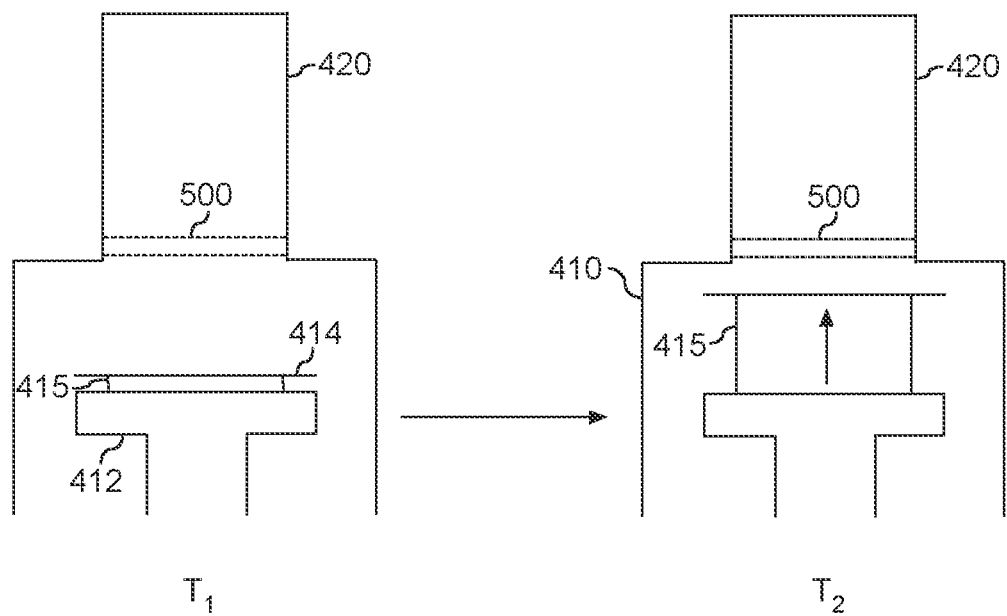
FIG. 6 depicts example heating of a workpiece according to example embodiments of the present disclosure.

In some embodiments, as shown in FIG. 6, the workpiece 414 can be heated to the second temperature by adjusting the vertical location of the workpiece 414 to a different vertical location relative to the plasma chamber 420 (e.g. with lift pins 415). For instance, as shown in FIG. 6, the lift pins 415 can maintain the workpiece 414 at a first vertical location from the plasma chamber 420 to expose the workpiece to the gas mixture including HF vapor at the first temperature for the doped silicate glass etch process. The lift pins 415 can lift the workpiece 414 to a second vertical location from the plasma chamber 420 that is closer to the plasma chamber 420 relative to the first vertical location to expose the workpiece to the HF vapor at the second temperature for the residue removal process.

At (210) of FIG. 2, the method can include exposing the workpiece to a gas mixture including HF vapor at the second temperature to remove residue on the workpiece. The residue can include a boron containing substance and/or a phosphorus containing substance. For instance, the residue can include one or more of $B_2O_3$, $H_3BO_3$, $P_2O_5$, $H_3PO_4$, etc. The residue can also include one or more etch byproducts, such as $H_2SiF_6$ and $H_2O$.

In some embodiments, the gas mixture can be the same gas mixture exposed to the workpiece at (206). For instance, there can be a continuous exposure of the gas mixture to the workpiece while the workpiece is heated from the first temperature to the second temperature to remove the residue. As an example, in the embodiment illustrated in FIG. 4, the gas flow system of the apparatus 400 can deliver a continuous flow of the gas mixture 155 into the processing chamber or a continuous flow of radicals generated in a plasma for exposure to the workpiece 414.

The method can include at (212) removing the workpiece from the processing chamber. For instance, the workpiece 414 can be removed from the processing chamber 410 of the apparatus 400. In this way, both the doped silicate glass etch process and the residue removal process can be performed in-situ in the same processing chamber.

Figure 7:
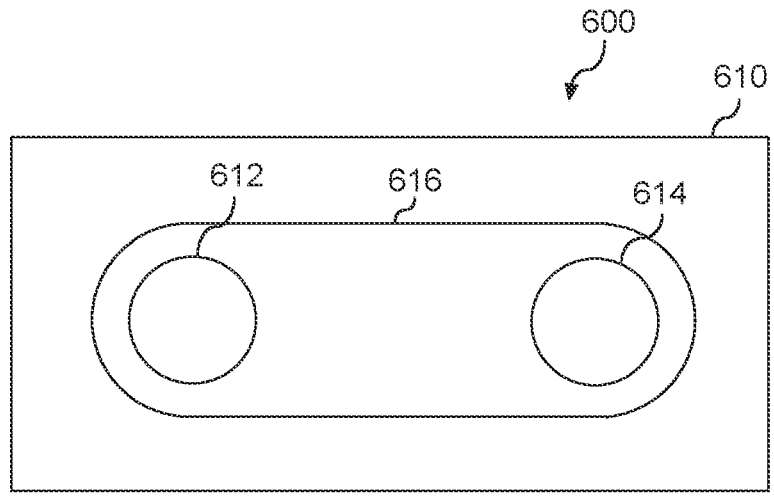
FIGS. 7 and 8 depict example processing apparatus according to example embodiments of the present disclosure.

In example embodiments, the silicate glass removal process according to example embodiments of the present disclosure can be implemented such that the silicate glass etch process is performed when heating the workpiece to the first temperature on a pedestal in a processing chamber and the residue remove process is performed when heating the workpiece to the second temperature using a different pedestal in the same processing chamber. For instance, FIG. 7 depicts a plane view of a processing chamber 610 of an apparatus 600 having a first pedestal 612 and a second pedestal 614. The first pedestal 612 and the second pedestal 614 may be part of the same integral structure 616 or may be physically separated. The silicate glass etch process can be implemented by heating the workpiece to the first temperature at the first pedestal 612. The workpiece can be transferred to the second pedestal 614 where the residue removal process can be implemented by heating the workpiece to the second temperature that is greater than the first temperature. The workpiece can be exposed to a gas mixture including HF vapor at both the first pedestal 612 and the second pedestal 614.

Figure 8:
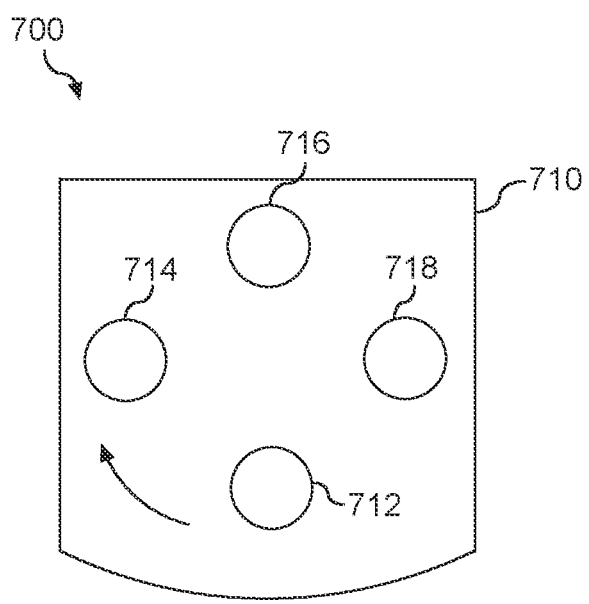

In some embodiments, the silicate glass removal process according to example embodiments can be performed with the workpiece at different processing stations in an apparatus having a carousel configuration. For instance, FIG. 8 depicts one example processing apparatus 700 having a carousel configuration. The apparatus 700 can rotate a workpiece among different processing stations, 712, 714, 716, and 718 in a processing chamber 710. The silicate glass etch process can be implemented by heating the workpiece to the first temperature at the first processing station 712. The workpiece can be rotated to the second processing station 714 where the residue removal process can be implemented by heating the workpiece to the second temperature that is greater than the first temperature. The workpiece can be exposed to a gas mixture including HF vapor at both the first processing station 712 and the second pedestal 714. Different workpiece processing steps can optionally be performed at processing stations 716 and 718.

In some embodiments, the silicate glass removal process according to example aspects of the present disclosure can be implemented in different process chambers. For instance, the silicate glass removal process can be implemented such that the silicate glass etch process is performed by heating the workpiece to the first temperature in a first process chamber and the residue removal process is performed by heating the workpiece to the second temperature in a different process chamber (e.g., a second process chamber as part of a cluster tool).

Figure 9:
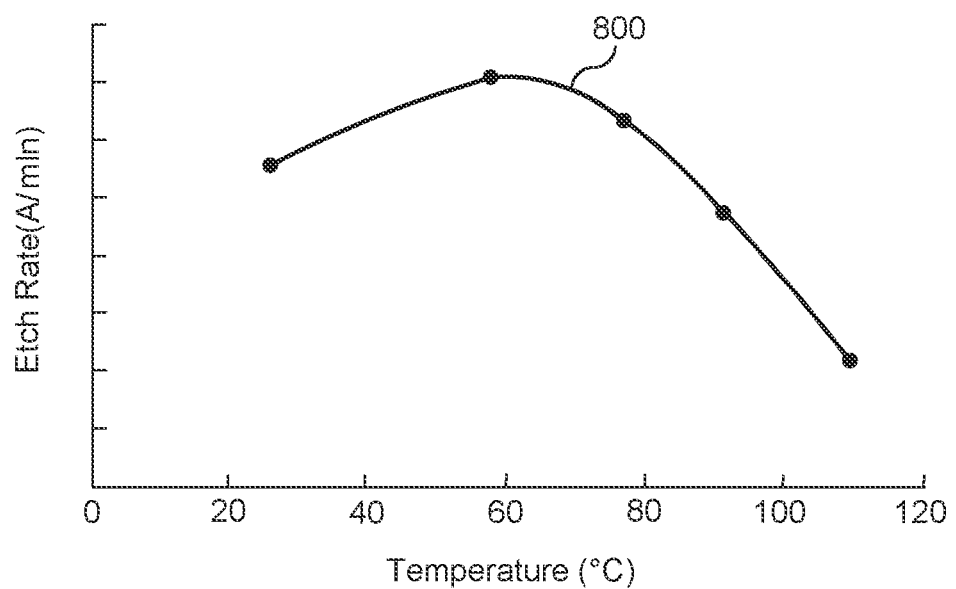
FIG. 9 depicts example control of etch rate based on temperature according to example aspects of the present disclosure.

FIG. 9 depicts example etch rate of the doped silicate glass layer as a function of workpiece temperature during a doped silicate glass etch process according to example aspects of the present disclosure. As shown by curve 800, high etch rates of doped silicate glass can be achieved by exposing the workpiece to a gas mixture including HF vapor at temperatures in the range of greater than or equal to about 100° C. The temperature can be adjusted to achieve a desired etch rate for the doped silicate glass layer.

Example process parameters for an example doped silicate glass etch process are provided below:

Gas Mixture: HF Vapor+Carrier Gas
HF Partial Pressure: 10 mTorr to 10 Torr
Total Gas Flow Rate: 100 sccm-20 slm
First Temperature: 20° C. to 200° C.
Second Temperature is higher than First Temperature and
Second Temperature: 150-300° C.

Example selectively results for a doped silicate glass etch process relative to other layers on a workpiece obtained using the process parameters set forth in the example above are shown in Table 1 below.

| Material | Etch Amount (Angstroms) | Selectivity BPSG to layer |
| --- | --- | --- |
| BPSG | >4500 | n/a |
| Thermal oxide | <1 | >4500 |
| TEOS Oxide | <4 | >1,000 |
| TiN | <4 | >1,000 |
| LPCVD Nitride | 2 | >2,000 |
| PECVD Nitride | <5 | ~1,000 |
| Poly silicon | <1.5 | >3,000 |

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for etching a doped silicate glass layer on a workpiece, wherein the workpiece comprises the doped silicate glass layer and at least one second layer, the second layer being a different material than the doped silicate glass layer, and the method comprising:

placing the workpiece on a workpiece support in a processing chamber;

generating a mixture from a plasma in a remote plasma chamber from a process gas comprising hydrogen containing precursors and fluorine containing precursors;

exposing the workpiece to the mixture when the workpiece is at a first temperature;

increasing a temperature of the workpiece to a second temperature by heating the workpiece using a heat source;

exposing the workpiece to the mixture generated from the plasma in the remote plasma chamber during increasing of the workpiece to the second temperature;

exposing the workpiece to the mixture generated in the remote plasma chamber when the workpiece is at the second temperature;

removing the workpiece from the processing chamber.

2. The method of claim 1, wherein the doped silicate glass is borosilicate glass, and boron concentration is between about 1% and about 10%.

3. The method of claim 1, wherein the doped silicate glass is phosphosilicate glass, and phosphorus concentration is between about 1% and about 10%.

4. The method of claim 1, wherein the doped silicate glass is borophosphosilicate glass, boron concentration is between about 1% and about 10%, and phosphorus concentration is between about 1% and about 10%.

5. The method of claim 1, wherein the first temperature is in a range of about 20° C. to about 200° C.

6. The method of claim 1, wherein the first temperature is about 30° C. to about 90° C.

7. The method of claim 1, wherein the second temperature is about 150° C. to about 400° C.

8. The method of claim 1, wherein the second temperature is about 150° C. to about 250° C.

9. The method of claim 1, wherein the at least one second layer is titanium nitride.

10. The method of claim 1, wherein the at least one second layer is silicon nitride.

11. The method of claim 1, wherein the at least one second layer is silicon.

12. The method of claim 1, wherein the at least one second layer is undoped silicate glass.

13. The method of claim 1, wherein exposing the workpiece to the mixture when the workpiece is at a first temperature occurs when the workpiece is at a first vertical position.

14. The method of claim 13, wherein exposing the workpiece to the mixture when the workpiece is at the second temperature occurs at a second vertical position.

15. The method of claim 1, wherein the second vertical position is closer to a separation grid separating the processing chamber from the remote plasma chamber.

16. The method of claim 1, wherein the plasma is generated using an inductively coupled plasma source.

17. The method of claim 1, wherein the heat source comprises one or more heating elements located in the workpiece support.

18. The method of claim 1, wherein the heat source comprises one or more lamps.

19. The method of claim 1, wherein the heat source comprises the remote plasma chamber.

20. A method for etching a doped silicate glass layer on a workpiece, wherein the workpiece comprises a doped silicate glass layer and at least one second layer, the second layer being a different material than the doped silicate glass layer, and the method comprising:

placing the workpiece on a workpiece support in a processing chamber;

generating a mixture from a plasma in a remote plasma chamber from a process gas comprising hydrogen containing precursors and fluorine containing precursors;

exposing the workpiece to the mixture when the workpiece is at a first vertical position relative to the remote plasma chamber;

exposing the workpiece to the mixture generated in the remote plasma chamber when the workpiece is at a second vertical position relative to the remote plasma chamber;

removing the workpiece from the processing chamber.

\* \* \* \* \*